(12) United States Patent
Chang (10) Patent No.: US 7,411,808 B2
(45) Date of Patent: Aug. 12, 2008

(54) METHOD FOR READING ROM CELL (75) Inventor: Simon Chang, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 11/080,493

(22) Filed: Mar. 16, 2005

(65) Prior Publication Data
US 2005/0213362 A1 Sep. 29, 2005

(30) Foreign Application Priority Data
Mar. 17, 2004 (GB) ................................. 0406038.0

(51) Int. Cl.
*G11C 17/00* (2006.01)
(52) U.S. Cl. ........................... 365/104; 365/103; 365/94
(58) Field of Classification Search .................... 365/94, 365/104, 230.04, 72, 53, 103, 168, 63, 189.03, 365/203
See application file for complete search history.

(56) References Cited
U.S. PATENT DOCUMENTS
5,870,326 A * 2/1999 Schuelein .................... 365/94

6,002,607 A * 12/1999 Dvir ............................ 365/103
6,355,550 B1 * 3/2002 Parris et al. ................. 438/599
6,498,066 B2 * 12/2002 Parris et al. ................. 438/278
6,636,434 B2 * 10/2003 Poullet ........................ 365/94

* cited by examiner

*Primary Examiner*—J. H. Hur
*Assistant Examiner*—Douglas King
(74) *Attorney, Agent, or Firm*—Novak Druce DeLuca + Quigg LLP (57) ABSTRACT

A method for reading data stored in a multiple bit memory cell, the memory cell comprising a switch located within an array of switches arranged in columns and rows, each switch having a control node and first and second switched nodes between which the flow of current is dependent on the voltage applied to the control node, wherein each row has a word line connected to the control nodes of the switches of that row, each column comprises only one switch from each row, and each column has first, second and third bit lines connectable to one of the switched nodes of each switch of that column to define the stored data, the method comprising: fixing the voltage of the second bit line of the switch and reading data from the first and third bit lines, and subsequently: fixing the voltage of the first bit line of the switch and reading data from the second and third bit lines.

7 Claims, 6 Drawing Sheets

METHOD FOR READING ROM CELL

BACKGROUND OF THE INVENTION

The present invention relates to ROMs (read-only memories), and in particular to a method of reading data from multiple bit line ROMs.

1. Field of the Invention

There is a general motivation in the field of ROM cell technology to produce smaller ROM cells than are currently available, so that chip areas can be reduced while still storing large amounts of data.

2. Description of the Related Art

Figure 1:
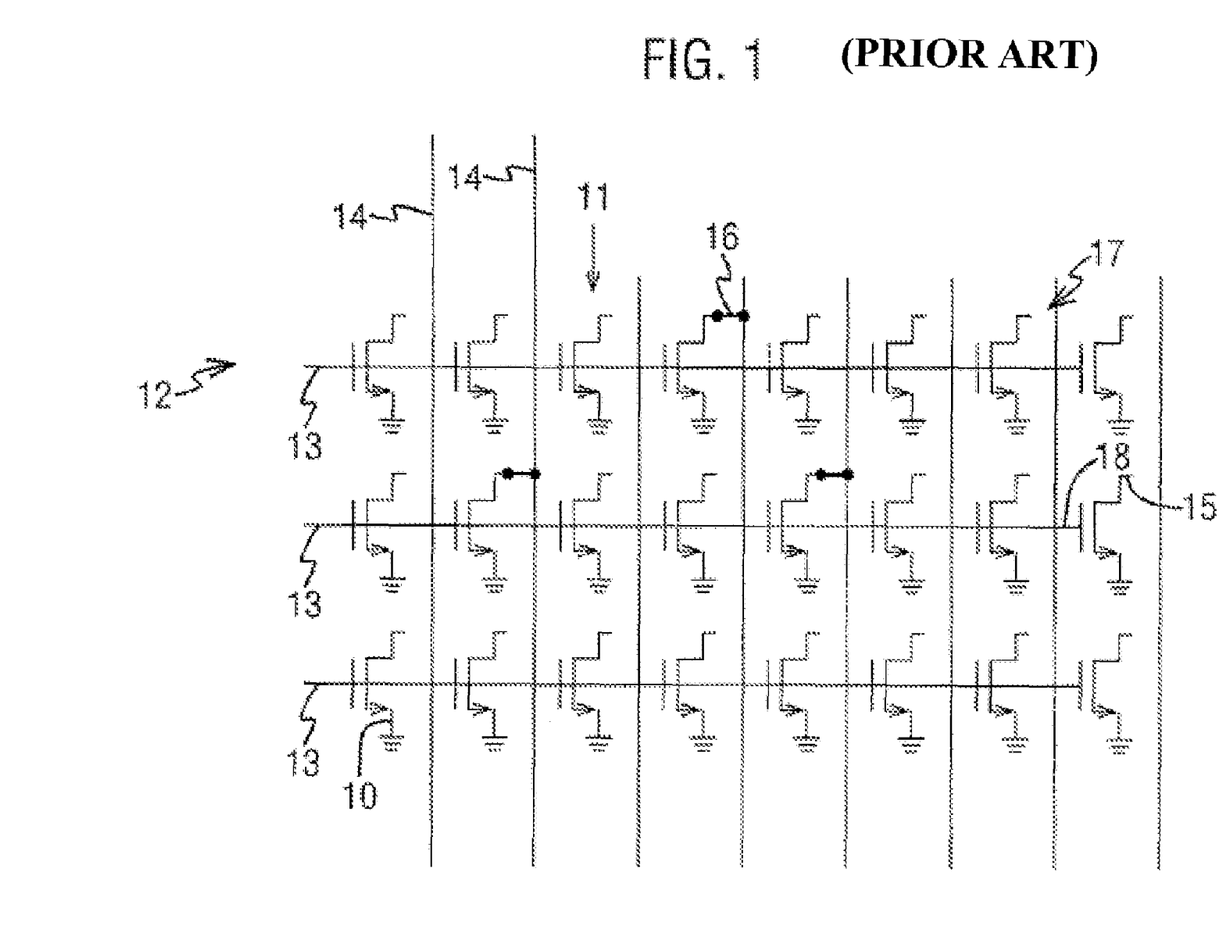
FIG. 1 shows a single bit line NMOS ROM cell.

ROMs are typically based on arrays of transistors. For example, NMOS transistors may be used. One configuration using NMOS transistors involves an array in which each transistor is grounded at its source terminal 10 as shown in FIG. 1. Alternatively, PMOS transistors may be used, or a combination of both NMOS and PMOS. In any case, the transistors will typically be arranged in columns 11 and rows 12 as can be seen in FIG. 1. Transistors in the same row 12 will share a common gate connection 13, referred to herein as a word line. Transistors in the same column 11 will share a single output wire 14, referred to herein as a bit line.

Programming of the NMOS ROM shown in FIG. 1, is achieved by selectively connecting the bit lines 14 to the drain terminals 15 of the transistors in the array. A connection may be made by inserting a via 16 between a bit line and a drain. In an NMOS ROM, a via 16 programmes a "0" bit. Conversely, a non-connection 17 programmes a "1" bit.

A ROM is read using the gate 18 and the drain 15 terminals of the transistors. First, all word lines 13 are grounded and the bit lines are pre-charged to $V_{DD}$. Next, the pre-charging circuitry is switched off and the appropriate word line 13 is activated, that is, a positive voltage $V_{CC}$ is applied to the word line. If there is a connection 16 between an activated transistor and a bit line, the voltage on the bit line will be pulled down to zero volts, and can be interpreted as a "0" in the data. If there is no connection 17 between an activated transistor and a bit line, the bit line will remain floating and will give a high voltage (a "1").

It can clearly be seen that the technique described above only allows for one bit of data to be stored per transistor. Since the density at which interconnects can be defined is much greater than the density at which transistors can be defined, it is desirable to create a ROM structure in which multiple bits may be stored per transistor. In such a structure, the bits may be encoded by means of multiple available configurations of interconnects to the transistor.

Figure 2A:
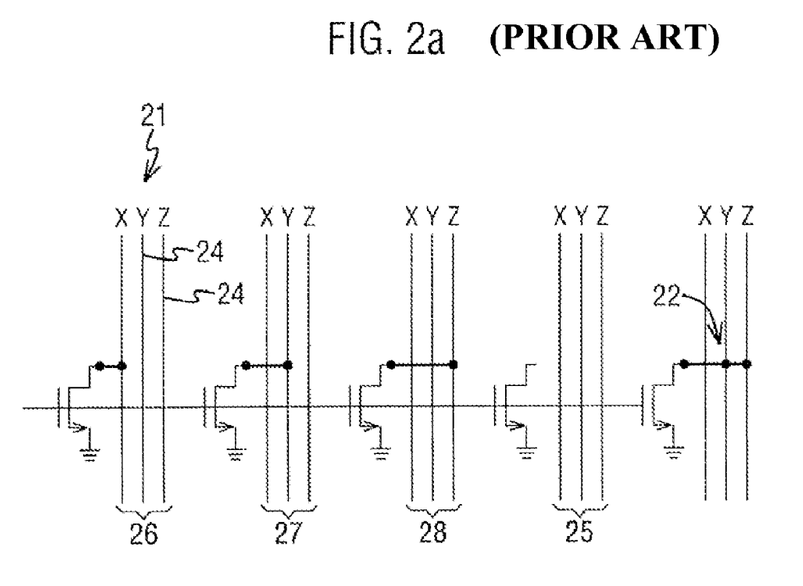
FIG. 2 shows a three bit line NMOS ROM cell.

One way of implementing the concept of storing multiple bits per transistor is to have multiple bit lines 24 for each column 21, as shown in FIG. 2A. However, it should be noted that the number of bits that can be stored in each ROM cell is not proportional to the number of bit lines (X, Y, Z) per column. This is because connections to more than one bit line for a given transistor will short the different bit lines together and will not give a meaningful reading. This situation is shown as 22 in FIG. 2A.

Since multiple bit line connections per transistor are not possible, there are four possible states that can be used to store data in the ROM cell depicted in FIG. 2A. 26, 27 and 28 show vias connected between drain terminals and bit lines X, Y and Z respectively. 25 shows a fourth possible state in which the drain terminal is not connected to any of bit lines X, Y or Z.

The four states can be detected in a manner similar to that used for a standard single bit line ROM cell, as described above. The states can be decoded into a series of 2-bit words, as shown in the following truth table:

TABLE 1

| Configuration (see FIG. 2) | X | Y | Z | Bit 1 | Bit 2 |
|---|---|---|---|---|---|
| 25 | 1 | 1 | 1 | 0 | 0 |
| 26 | 0 | 1 | 1 | 0 | 1 |
| 27 | 1 | 0 | 1 | 1 | 0 |
| 28 | 1 | 1 | 0 | 1 | 1 |

Table 1 is merely one example of one way in which the detected values may be decoded. In the present example of an NMOS ROM cell, a reading of "111" would mean that no connections were in place between the drain terminal of the transistor and the bit lines X, Y and Z. In the example of Table 1, the state 111 would mean a word "00" had been encoded. A reading of "101" would mean that a via was in place between terminal Y and the drain terminal, and this would correspond to the word "10".

In general, $2^n$ n-bits words can be encoded into $2^n-1$ bit line connections. However, it has been found that in practice it is only useful to use three bit lines (n=2).

Figure 2B:
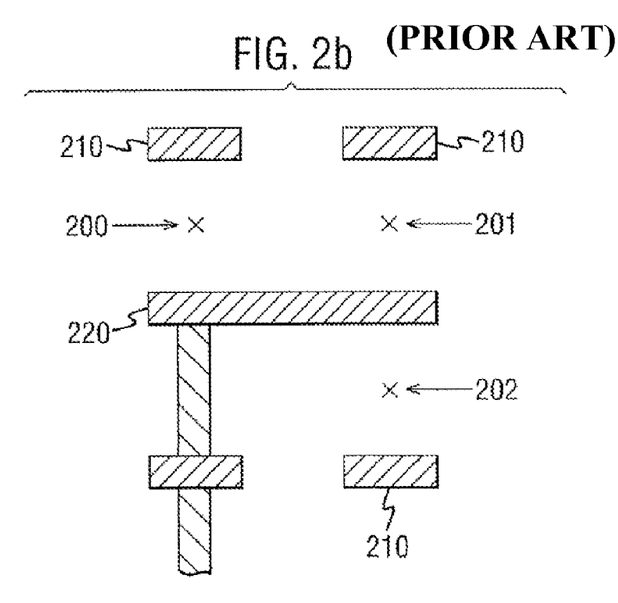

U.S. Pat. Nos. 6,355,550 and 6,498,066 disclose ROMs using three bit lines per column. The ROMs are embedded in multi-layered integrated circuits. FIG. 2B shows a representation of the possible connections in such prior art ROMs. "x" represents a position where a via may be placed in order to form a connection. Connections may be made at points 200, 201 or 202 between conductive pad 220 and bit lines 210, thus giving four possible states (200, 201, 202 or no connection).

ROM cells such as those described above are typically fabricated using a series of masks and applying a series of patterned layers to a substrate. (See U.S. Pat. Nos. 6,355,550 and 6,498,066.)

Figure 3:
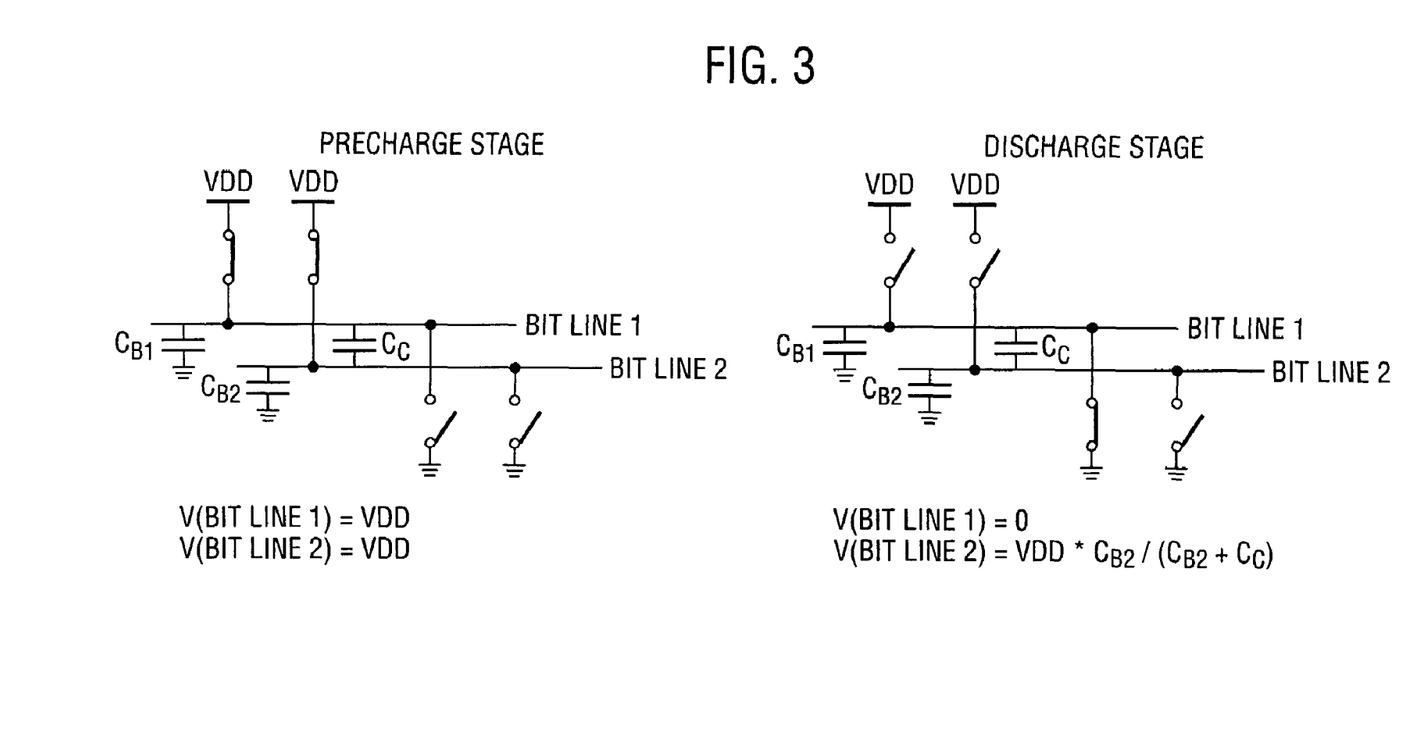
FIG. 3 shows bit lines of a ROM in pre-charge and discharge states.

One of the potential problems concerning multiple bit line ROMs is the effect of capacitive coupling. Distortion of stored data can arise if a change in voltage on one bit line causes a corresponding change in an adjacent bit line through capacitive charge sharing. FIG. 3 illustrates the process of this capacitive charge sharing.

In the pre-charge state, two adjacent bit lines are connected to voltage $V_{DD}$. In this state, V(bit line 1)=V(bit line 2)=$V_{DD}$.

In the discharge state the bit lines are disconnected from $V_{DD}$ and instead bit line 1 is grounded and bit line 2 is left floating. In this state, V(bit line 1)=0 and V(bit line 2)=$V_{DD} \times C_{B2}/(C_{B2}+C_C)$, where $C_C$ is the capacitance between bit lines 1 and 2 through the dielectric substrate that separates them. Thus, some of the charge stored in $C_{B2}$ moves onto $C_C$ and the voltage on bit line 2 is reduced. If $C_C$ is large enough compared to $C_{B2}$, the voltage on bit line 2 may incorrectly be read as a "0".

In single bit line ROMs, this problem can be overcome by interleaving columns of bit cells and grounding bit lines associated with unused bit cells. For example, odd columns could be used for odd addresses and even columns for even addresses. In this way, at any given time the bit lines adjacent to a sensitive bit line will be grounded, and no coupling can occur.

However, with multi-bit ROMs the situation is more complicated since the three bit lines associated with each column will all be sensitive at the same time. The problem of coupling therefore remains to be solved in a different way.

A further disadvantage that may be found with known multiple bit line ROMs is that several masks may need to be remade when a ROM is to be reprogrammed. A particular set of masks will be appropriate for a particular set of data to be programmed into a ROM, but when a different set of data need to be programmed several masks may need to be altered to produce different patterns on the substrate.

It is therefore an aim of the present invention to produce a multiple bit memory cell, and a method of reading such a memory cell, that can overcome the above-stated problems and disadvantages.

BRIEF SUMMARY OF THE INVENTION

In accordance with a first aspect of the present invention there is provided a method for reading data stored in a multiple bit memory cell, the memory cell comprising a switch located within an array of switches arranged in columns and rows, each switch having a control node and first and second switched nodes between which the flow of current is dependent on the voltage applied to the control node, wherein each row has a word line connected to the control nodes of the switches of that row, each column comprises only one switch from each row, and each column has first, second and third bit lines connectable to one of the switched nodes of each switch of that column to define the stored data, the method comprising: fixing the voltage of the second bit line of the switch and reading data from the first and third bit lines, and subsequently: fixing the voltage of the first bit line of the switch and reading data from the second and third bit lines.

The bit lines of each column being connectable to one of the switched nodes of each switch of that column, the other of the switched nodes of each switch may be connected to a reference voltage.

The steps of fixing the voltage of the first and second bit lines may comprise fixing the voltage of the respective line to the reference voltage. Alternatively, these steps may be replaced by steps of connecting the bit lines to a current sink.

The second bit lines can suitably be positioned between the first and third bit lines such that they can provide shielding between the first and third bit lines.

Suitably, the steps of the first aspect of the present invention may constitute a single read operation.

The switch is optionally a transistor.

According to a second aspect of the present invention there is provided a memory circuit disposed on a single integrated circuit substrate, and defined by a plurality of layers formed on the substrate, the memory circuit comprising an array of switches arranged in columns and rows, each switch having a control node and first and second switched nodes between which the flow of current is dependent on the voltage applied to the control node, wherein each row has a word line connected to the control nodes of the switches of that row, and each column has first, second and third bit lines connectable to one of the switched nodes of each switch of that column to define stored data by a pattern of connections between the bit lines and the switched nodes, and wherein the bit lines are separated from the switched nodes by a single layer of the integrated circuit, whereby the pattern of connections may be defined by configuration of that layer.

The second bit lines may be positioned between the first and third bit lines such that they can provide shielding between the first and third bit lines. At least some of the bit lines may be connected to the switched nodes of at least some of the switches by means of via holes through the said single layer. Alternatively or in addition at least some of the bit lines may be connected to the switched nodes of at least some of the switched by means of programmable metal connectors.

The memory circuit may be a ROM circuit.

BRIEF DESCRIPTION OF THE DRAWINGS

The present invention will now be described by way of example with reference to the drawings. In the accompanying drawings.

The present invention can be applied to ROMs that comprise an array of cells arranged in rows and columns. Each cell may comprise a transistor that can be used for sensing the data content of the cell. In this example the transistors are NMOS transistors. The transistors in each row have their gates connected to a word line of that row. The source of each transistor is connected to a reference voltage, conveniently ground. Each column includes a single transistor from each row. Each column has a number of bit lines, which can each independently be connected or not connected to the drain of each transistor in the column. The pattern of connections of the bit lines to the transistors defines the data stored in the ROM cell. As described above, to avoid shorts between the bit lines each transistor should be connected to no more than one of the bit lines.

FIG. 3 illustrates how charge sharing between adjacent bit lines can lead to false readings from ROMs. In an embodiment of the present invention this problem is overcome in a multiple bit line ROM by treating separately the two encoded bits associated with each column, and reading each bit independently. By doing this, one of the three bit lines may be grounded while the other two remain active, and the coupling effect is thus reduced.

Figure 4A:
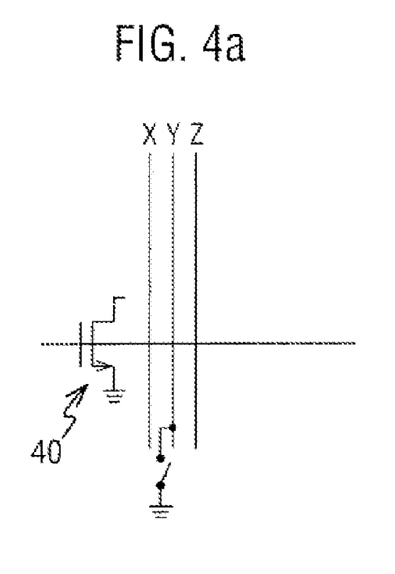
FIG. 4 shows a method of reading a three bit line ROM cell.

FIG. 4A shows the first stage of a method of reading data encoded in transistor 40 according to an embodiment of the invention. The middle bit line, Y, is grounded while bit lines X and Z remain active. Coupling between bit lines X and Z is relatively unlikely because the capacitance between X and Z (which causes coupling problems) will always be much less than the capacitances between X and Y or between Z and Y (which reduce coupling effects). The following truth table results when data is read in this way:

TABLE 2

| X | Y | Z | Bit 1 | Bit 2 |
|---|---|---|-------|-------|
| 1 | 0 | 1 | 0 | 0 |
| 0 | 0 | 1 | 0 | 1 |
| 1 | 0 | 1 | 1 | 0 |
| 1 | 0 | 0 | 1 | 1 |

The values of X and Z in each state are the same as those in Table 1, and the words (bits 1 and 2) have been encoded in the same way. The value of Y is zero in each state because bit line Y is grounded.

It can be seen that the first and third states in Table 2 result in identical values of X, Y and Z. However, the first and third states correspond respectively to words "00" and "10". Thus, it is not possible to determine accurately the value of bit 1.

Conversely, bit 2 may be accurately determined because the states resulting in bit 2 being high (or "1"), i.e. states 001 and 100, are distinct from the states resulting in bit 2 being low (or "0"), i.e. states 101. As a result, bit 2 can be determined while bit line Y is grounded.

DETAILED DESCRIPTION OF THE INVENTION

Figure 4B:
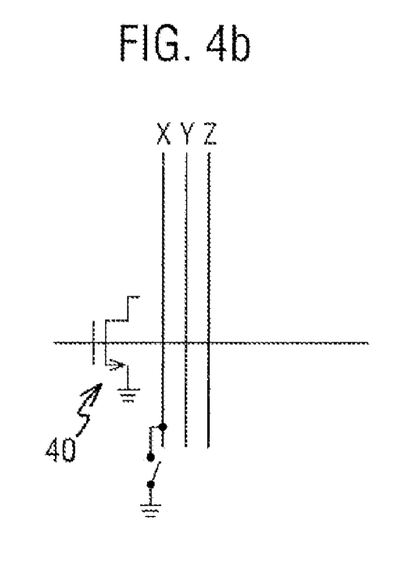

Determining bit 1 is more complicated. The X bit line is grounded, as shown in FIG. 4B, and data is read from bit lines Y and Z. However, because lines Y and Z are physically close it is possible that coupling will occur between these lines. The following truth table results:

TABLE 3

| X | Y | Z | Bit 1 | Bit 2 |
|---|---|---|-------|-------|
| 0 | 1 | 1 | 0 | 0 |
| 0 | 1 | 1 | 0 | 1 |
| 0 | 0 | ? | 1 | 0 |
| 0 | ? | 0 | 1 | 1 |

In Table 3, a "?" represents a value which may be read as 0 or 1 depending on the extent of coupling. Here, bit line X reads zero in each state. In the first and second states (011), the sensitive bit lines Y and Z are both high and therefore there will be no difficulty in establishing the values of these bit lines. However, because coupling may occur between lines Y and Z it may not be possible to determine accurately whether the bit lines are high or low in states where one or more bit lines is low.

Despite the possible effects of coupling, it is still possible to determine accurately the value of bit 1 while bit line X is grounded. It can be seen from Table 3 that the states in which bit 1 is high (00? and 0?0) can be distinguished from the states in which bit 1 is low (011).

Thus it can be seen that by first grounding bit line Y (FIG. 4A) and then grounding bit line X (FIG. 4B), the encoded word can unambiguously be determined. The following example illustrates this embodiment of the invention.

Suppose a word 10 is encoded and stored in a three bit line ROM as shown in FIG. 2. In accordance with the present embodiment, bit line Y will first be grounded while bit lines X and Z are read. The result will be state 101, as can be seen from Table 2. Referring to Table 2, state 101 may correspond to word 00 or to word 10 (the first and third states). Bit 2 must therefore be a 0.

Next, bit line X is grounded while lines Y and Z are read. The result should be state 001 (see Table 3); however, coupling may occur between lines Y and Z and bit line Z may lose some or all of its charge. Depending on how bad the coupling is, bit line Z may be read as a 0 or a 1, and the result may therefore be 000. State 000 could also arise from encoding of word 11, as can be seen from Table 3. However, states 00? and 0?0 to words 10 and 11 respectively, and bit 1 must therefore be as 1. Thus, the encoded word can be determined to be 10.

Alternatively, a bit line lay-out could be used in which the Y line does not provide physical shielding between X and Z. In such a case, the truth table resulting from the Y line being grounded would be:

TABLE 4

| X | Y | Z | Bit 1 | Bit 2 |
|---|---|---|-------|-------|
| 1 | 0 | 1 | 0 | 0 |
| 0 | 0 | ? | 0 | 1 |
| 1 | 0 | 1 | 1 | 0 |
| ? | 0 | 0 | 1 | 1 |

In this case, bit 2 is recoverable as it is from Table 2. Bit 2 will be a "0" only if X and Z are both "1". Bit 1 can then be recovered by grounding line X or line Z to produce the truth table of Table 3 or a corresponding table resulting from line Z being grounded.

Figure 7:
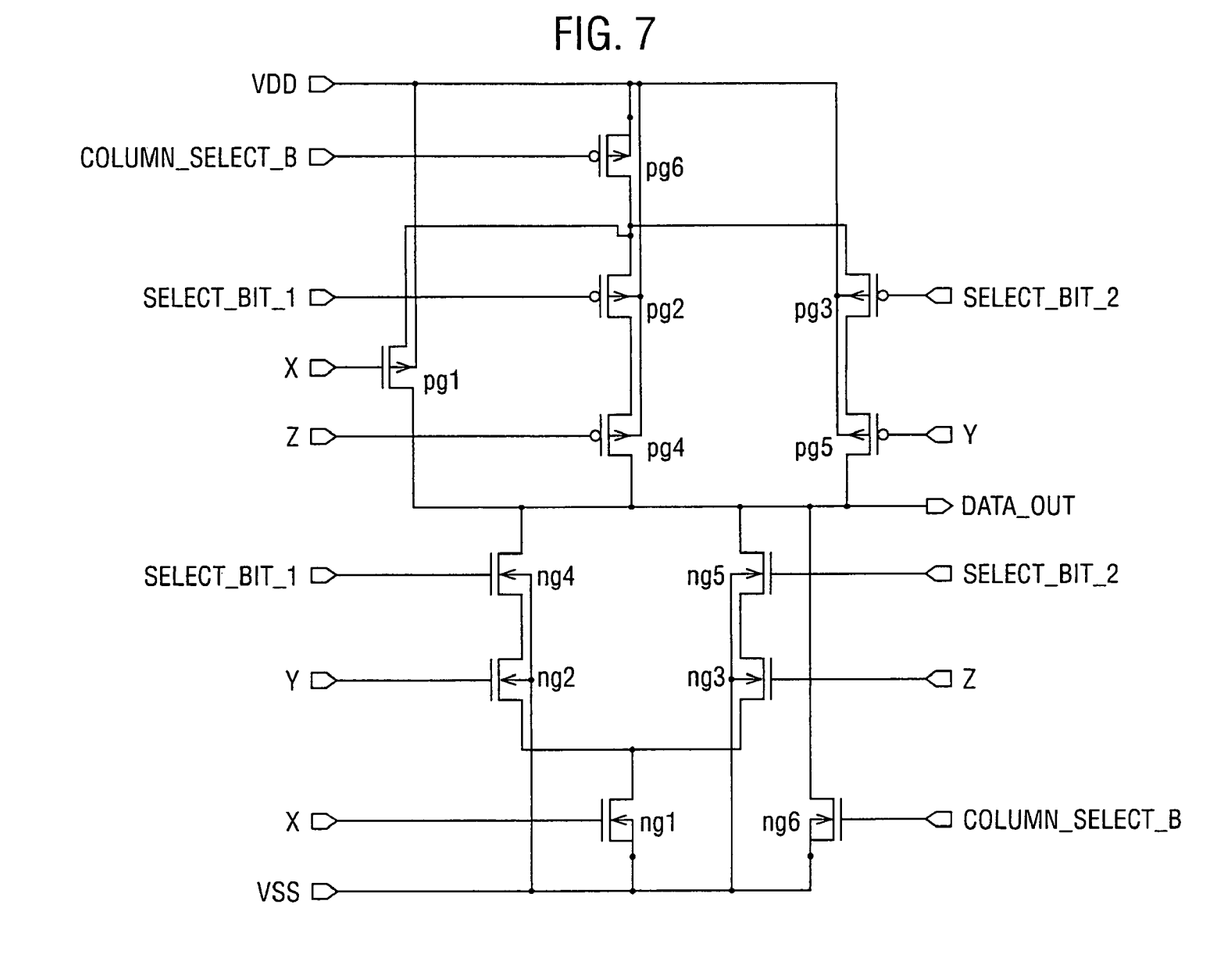
FIG. 7 shows an exemplary circuit configuration.

It should be noted that the value "?" could denote a voltage between $V_{CC}$ and zero, i.e. a mid-rail voltage, because of a line losing part of its charge due to coupling. When such a mid-rail voltage is applied to a logic gate, it could result in both NMOS and PMOS devices connected to the gate being turned on. This can cause a significant current drain, and is therefore undesirable. However, this situation can be avoided by careful design of the decoding logic, an example of which is shown in FIG. 7. In this arrangement, mid-rail voltage levels are avoided on one of the bit lines. For example, in a situation where Y is mid-rail with Z and X low, or where Z is mid-rail with X and Y low, transistor "ng1" will always be fully "off" and transistor "pg1" will always be fully "on", and there will be no conduction from $V_{DD}$ to $V_{SS}$.

Figure 5:
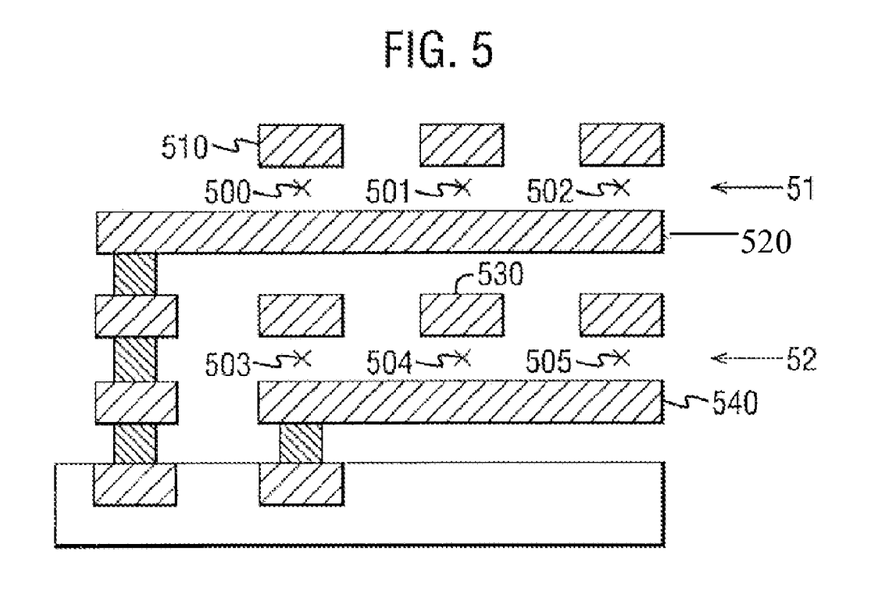
FIG. 5 shows a three bit line ROM cell having two programmable mask layers.
Figure 6:
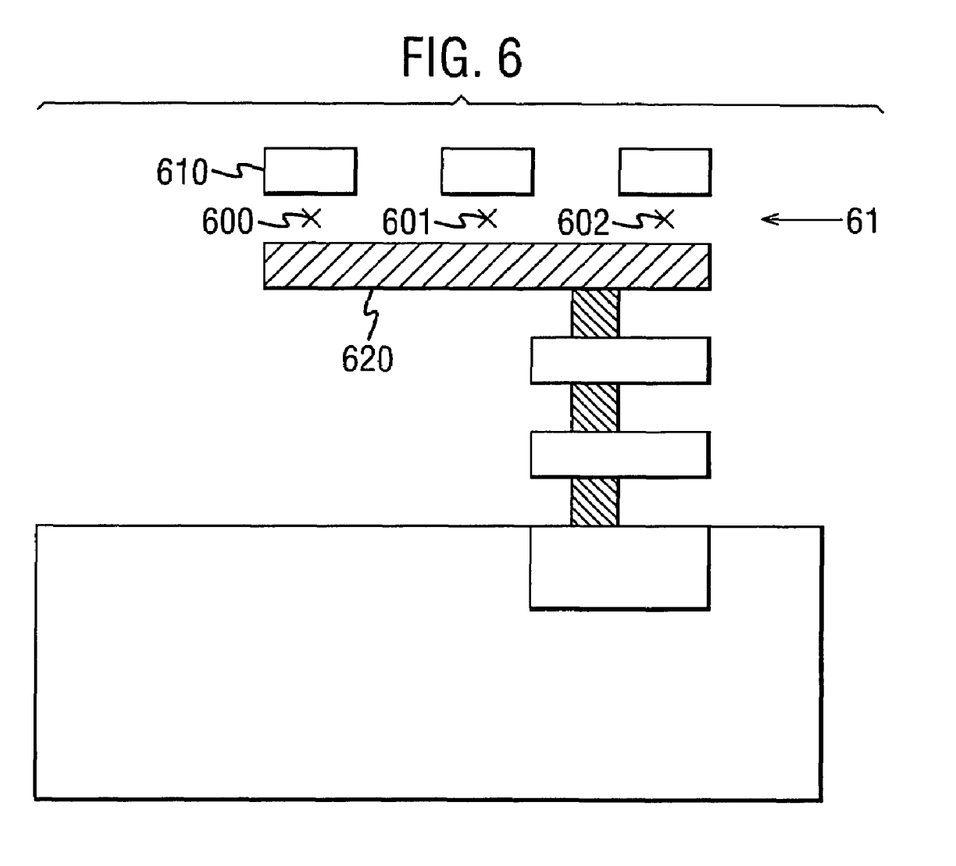
FIG. 6 shows a three bit line ROM cell having a single programmable mask layer.

FIGS. 5 and 6 show examples of three bit line ROMs in accordance with the present invention. As in FIG. 2B, "x" represents a position where a via may be placed. In FIG. 5, connections may be made at positions 500, 501 or 502 between bit lines 510 and conductor 520, which might be a drain terminal of an NMOS transistor. Connections may also be made at positions 503, 504 or 505 between bit lines 530 and conductor 540. In the ROM of FIG. 5, as in that of FIG. 2B, two separate mask layers, shown as 51 and 52 in FIG. 5, must be made in order to programme a ROM with a particular set of data.

In FIG. 6 connections may be made at positions 600, 601 or 602 between bit lines 610 and conductor 620. In this embodiment, only one mask layer 61 needs to be made to programme the ROM. This results in a substantial saving in the time and cost associated with programming ROMs.

An exemplary ROM cell in accordance with the present invention will now be considered.

The exemplary NMOS ROM is shown in FIG. 5 and has dimensions of 2.80 µm×1.42 µm, giving an area of 3.976 µm². Eight bits may be stored per cell (e.g. four 2-bit words), so that one bit requires approximately 0.5 µm² of the cell. For example, if it is required to store 4 Mbits on a ROM then the ROM will need to be at least $(4\times10^6)\times0.5$ µm², i.e. 2 mm². The total area required to store 4 Mbits of data, including core overhead, will be about 2.3 mm². The exemplary ROM contains 0.18 µm NMOS transistors.

Whilst the present invention has been described with reference to ROM cells, if the pattern of connections of the bit lines to the transistors were dynamically writable, for example by means of programmable metal connections, then the data stored in the cell could be re-defined. So the cells could be used for random access or writable non-volatile memory.

Instead of transistors other forms of switch that permit current to flow from a first node (equivalent to the drain of the transistors described above) to a second node (equivalent to the source of the transistors described above) in dependence on the voltage applied to a control input (equivalent to the gate of the transistors described above) could be used. Although the description above is made with reference to NMOS transistors, PMOS transistors could be used.

The applicant draws attention to the fact that the present invention may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the invention.

The invention claimed is:

1. A method for reading data stored in a multiple bit memory cell, the memory cell comprising a switch located within an array of switches arranged in columns and rows, the array of switches consisting of switches that each have a control node and first and second switched nodes between which the flow of current is dependent on the voltage applied to the control node, wherein each row has a word line connected to the control nodes of the switches of that row, each column comprises only one switch from each row, and each column has first, second and third bit lines connectable to one of the switched nodes of each switch of that column to define the stored data, the other of the switched nodes of each switch being connected to a reference voltage, the method comprising:
fixing the voltage of the second bit line of the switch while simultaneously reading data from the first and third bit lines, and subsequently:
fixing the voltage of the first bit line of the switch while simultaneously reading data from the second and third bit lines.

2. A method according to claim 1, wherein the steps of fixing the voltage of the first and second bit lines comprise fixing the voltage of the respective line to the reference voltage.

3. A method according to claim 1 wherein the second bit lines are positioned between the first and the third bit lines such that they can provide shielding between the first and third bit lines.

4. A method according to claim 1 wherein the steps recited constitute a single read operation.

5. A method according to claim 1 wherein the switch is a transistor.

6. A method for reading data stored in a multiple bit memory cell, the memory cell comprising a switch located within an array of switches arranged in columns and rows, the array of switches consisting of switches that each have a control node and first and second switched nodes between which the flow of current is dependent on the voltage applied to the control node, wherein each row has a word line connected to the control nodes of the switches of that row, each column comprises only one switch from each row, each column has first, second and third bit lines connectable to one of the switched nodes of each switch of that column to define the stored data and, the bit lines of each column being connectable to one of the switched nodes of each switch of that column, the other of the switched nodes of each switch are connected to a reference voltage, the method comprising:
fixing the voltage of the second bit line of the switch while reading data from the first and third bit lines, and subsequently:
fixing the voltage of the first bit line of the switch while simultaneously reading data from the second and third bit lines;
wherein the steps of fixing the voltage of the first and second bit lines comprise fixing the voltage of the respective line to the reference voltage.

7. A method for reading data stored in a multiple bit memory cell, the memory cell comprising a switch located within an array of switches arranged in columns and rows, the array of switches consisting of switches that each have a control node and first and second switched nodes between which the flow of current is dependent on the voltage applied to the control node, wherein each row has a word line connected to the control nodes of the switches of that row, each column comprises only one switch from each row, and each column has first, second and third bit lines connectable to one of the switched nodes of each switch of that column to define the stored data, the other of the switched nodes of each switch being connected to a reference voltage, the method comprising, in a single read operation:
fixing the voltage of the second bit line of the switch while simultaneously reading data from the first and third bit lines, and subsequently:
fixing the voltage of the first bit line of the switch while simultaneously reading data from the second and third bit lines.

* * * * *